(12) United States Patent
Huang et al.

(10) Patent No.: US 8,049,836 B2
(45) Date of Patent: *Nov. 1, 2011

(54) DISPLAY DEVICE, A FRONT FRAME USED THEREIN, AND A METHOD OF MANUFACTURE THEREOF

(75) Inventors: Hsin-Tao Huang, Hsin-Chu (TW); Hsiu-Mei Fang, Hsin-Chu (TW)

(73) Assignee: Au Optronics Corporation, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/048,194

(22) Filed: Mar. 15, 2011

(65) Prior Publication Data

US 2011/0164395 A1 Jul. 7, 2011

Related U.S. Application Data

(62) Division of application No. 12/055,568, filed on Mar. 26, 2008, now Pat. No. 7,936,416.

(30) Foreign Application Priority Data

Apr. 25, 2007 (TW) ................................ 96114680 A (51) Int. Cl.
*G02F 1/1333* (2006.01)
(52) U.S. Cl. ........................................... 349/58; 349/60
(58) Field of Classification Search ....................... 349/60
See application file for complete search history.

(56) References Cited

U.S. PATENT DOCUMENTS

| 6,888,591 | B2 | 5/2005 | Kim |
| 6,950,154 | B2 | 9/2005 | Lee |
| 7,379,128 | B2 * | 5/2008 | Tsubokura et al. ............. 349/60 |
| 7,457,577 | B2 | 11/2008 | Matsunaka et al. |
| 7,505,092 | B2 * | 3/2009 | Ichioka et al. .................. 349/60 |
| 7,936,416 | B2 * | 5/2011 | Huang et al. .................... 349/58 |

FOREIGN PATENT DOCUMENTS

JP 2000-47210 2/2000

OTHER PUBLICATIONS

English language translation of JP 2000-47210, published Feb. 18, 2000.

* cited by examiner

*Primary Examiner* — Omar Rojas
(74) *Attorney, Agent, or Firm* — Thomas, Kayden, Horstemeyer & Risley, LLP (57) ABSTRACT

A display device, a front frame used therein, and a method of manufacture thereof are provided. The display device includes a display panel and the front frame. The display panel has a display surface which is partially covered by the front frame. The front frame includes a side wall corresponding to the sides of the display panel, a top plate extending from the side wall towards the center of the display panel, and cushion filler. The top plate has an inner surface featuring a groove distributed along the side wall. The cushion filler is contained within the groove while its top protrudes from the groove and contacts the display surface outside an active area.

41 Claims, 12 Drawing Sheets

DISPLAY DEVICE, A FRONT FRAME USED THEREIN, AND A METHOD OF MANUFACTURE THEREOF

CROSS-REFERENCES TO RELATED APPLICATIONS

This is a divisional application of patent application Ser. No. 12/055,568 filed on Mar. 26, 2008, now U.S. Pat. No. 7,936,416. The prior application Ser. No. 12/055,568 claims the benefit of Taiwan Patent Application No. 096114680 filed on Apr. 25, 2007, the disclosures of which are incorporated herein by reference in their entirety.

BACKGROUND OF THE INVENTION

1. Field of the Invention

This invention relates to a display device, a front frame used therein, and a method of manufacture thereof.

2. Description of the Prior Art

Display panels such as LCD (Liquid Crystal Display) panels and OLED (Organic Light Emitting Diode) panel and display device using the display panel are becoming the mainstream in the field of display device. Products such as various types of display screens, home flat screen television, flat panel monitors of the personal computer and of the laptop, display screen of the mobile phone and the digital camera, use display panels as one of the essential components.

Figure 1A:
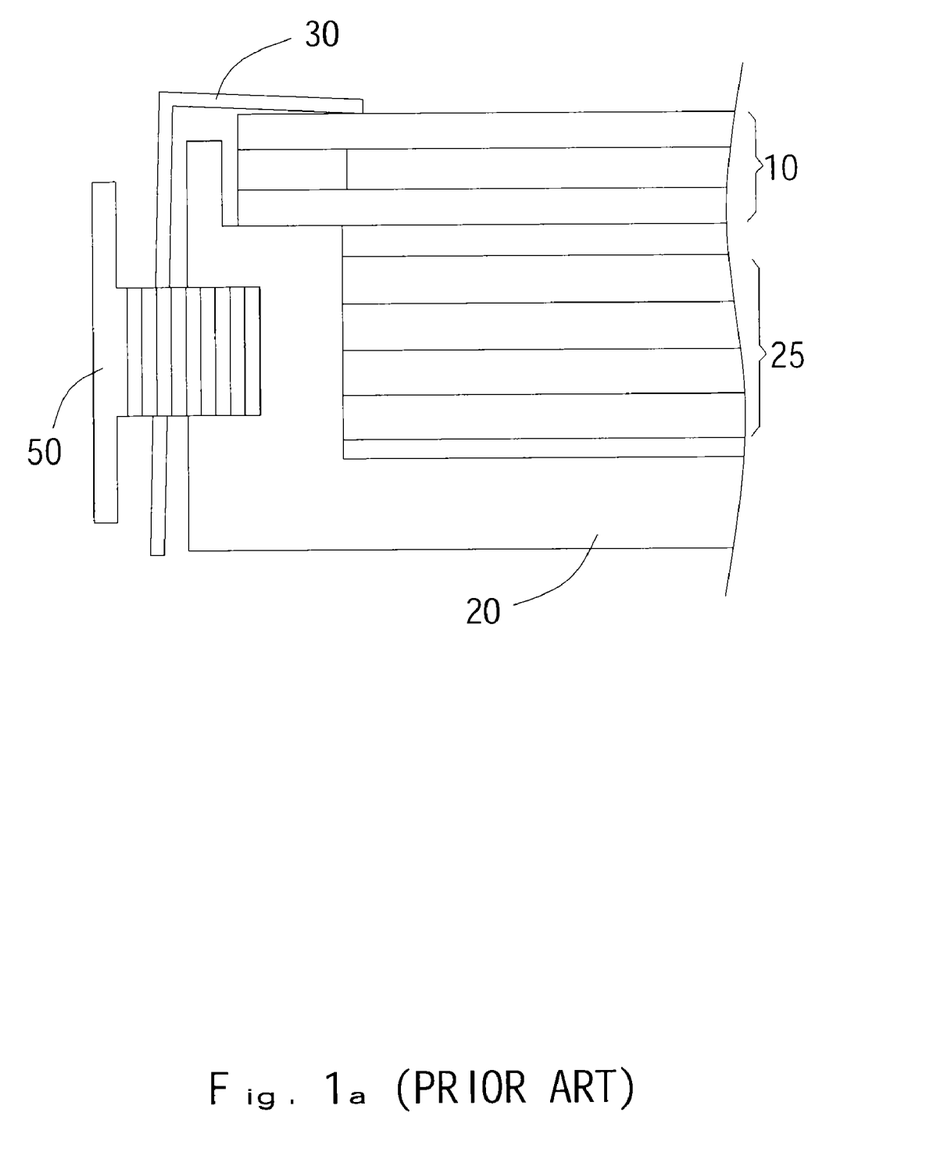
FIG. 1a and FIG. 1b are the cross-sectional view of a conventional display device.

FIG. 1a shows a conventional display device using display panel. As FIG. 1a shows, the display device includes a display panel 10, an outer frame 30, a back light module 25 and a substrate 20. The back light module 25 is disposed above the substrate 20 and the display panel 10 is disposed above the back light module 25. The outer frame 30 covers the edge of the display panel 10 and covers the lateral side of the substrate 20. Conventionally the outer frame 30 and the back light module 25, disposed between the substrate 20 and the display panel 10, are fastened by screwing the outer frame 30 on the lateral side of the substrate 20 with a screw 50. However, due to bad assembly or external forces, the stress exerted by the screw 50 may create local deformation in the outer frame 30. The outer frame 30 then presses the display surface of the display panel 10 and influences the displayed images on the display surface.

Figure 1B:
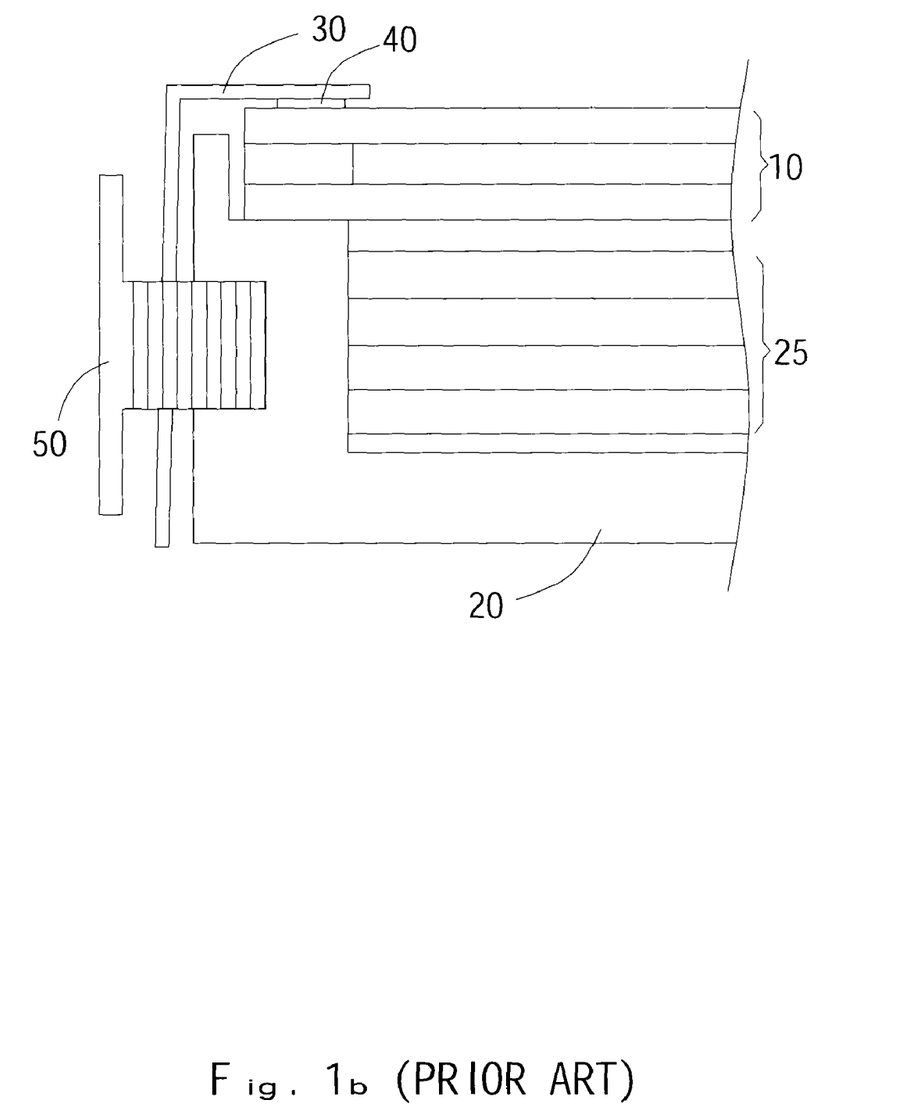

In order to solve this problem, conventionally a pad 40 is pasted on inner side of the outer frame 30. As shown in FIG. 1b, the pad 40 contacts the edge of the display area of the display panel 10. This step reduces the pressing forces on the tip of the outer frame on the display surface due to the stress of the screw 50. However, the step of pasting the pad 40 is done manually and may increase the overall work time and costs required. Furthermore, problem of insufficient accuracy in pad pasting may arise which further influences the overall quality of the products.

SUMMARY OF THE INVENTION

It is an objective of the present invention to provide a front frame and a display device using the front frame to reduce the deformation stress of the front frame exerted on the active area of the display panel.

It is another objective of the present invention to provide a front frame and a display device using the front frame to reduce the production costs.

It is another objective of the present invention to provide a front frame and a display device using the front frame to reduce the assembly time.

It is another objective of the present invention to provide a manufacture method of display devices to reduce the production costs and the assembly time.

The display device of the present invention includes a display panel, a base and a front frame, wherein the display panel is disposed between the substrate and the front frame. The display panel has a display surface and the display surface has an active area. When the display device is placed horizontally, the front frame partly covers the display panel as well as the lateral sides of the display panel and the base.

The front frame includes a side wall and a top plate. The side wall corresponds to lateral sides of the display panel, and the top plate extends from top edge of the side wall towards the center of the display panel along the display surface of the display panel. The front frame has an opening, wherein the active area of the display panel displays the images outwards through the opening. The top plate has an inner surface which faces the display surface and the inner surface is disposed with a groove distributed along the side wall.

The front frame further includes cushion filler. The cushion filler is disposed in the groove. Top of the cushion filler protrudes from the groove and from the inner surface of the top plate. The cushion filler contact the outside of the active area. Disposition of the cushion filler reduces the occurrence of inferior displayed images caused by stresses of tip of the top plate exerted on the display device.

The manufacture method of the display device of the present invention includes the following steps. The first step includes filling the groove on the inner surface of the front frame with cushion filler and thus the top of the cushion filler could protrude from the inner surface. The second step includes solidifying the cushion filler in accordance with the characteristics of the cushion filler. The third step includes assembling the front frame with the display panel so that the cushion filler could contact the outside of the active area of the display surface.

DETAILED DESCRIPTION OF THE PREFERRED EMBODIMENT

The present invention provides a display device, a front frame used by the display device and a manufacture method of the display device. The display device of the present invention includes LCD (Liquid Crystal Display) device, OLED (Organic Light Emitting Diode) display device and other types of multi-color or single-color display devices. The front frame partly covers a display panel of the display device. The material of the front frame can be metal, plastic and other organic or inorganic materials.

Figure 2:
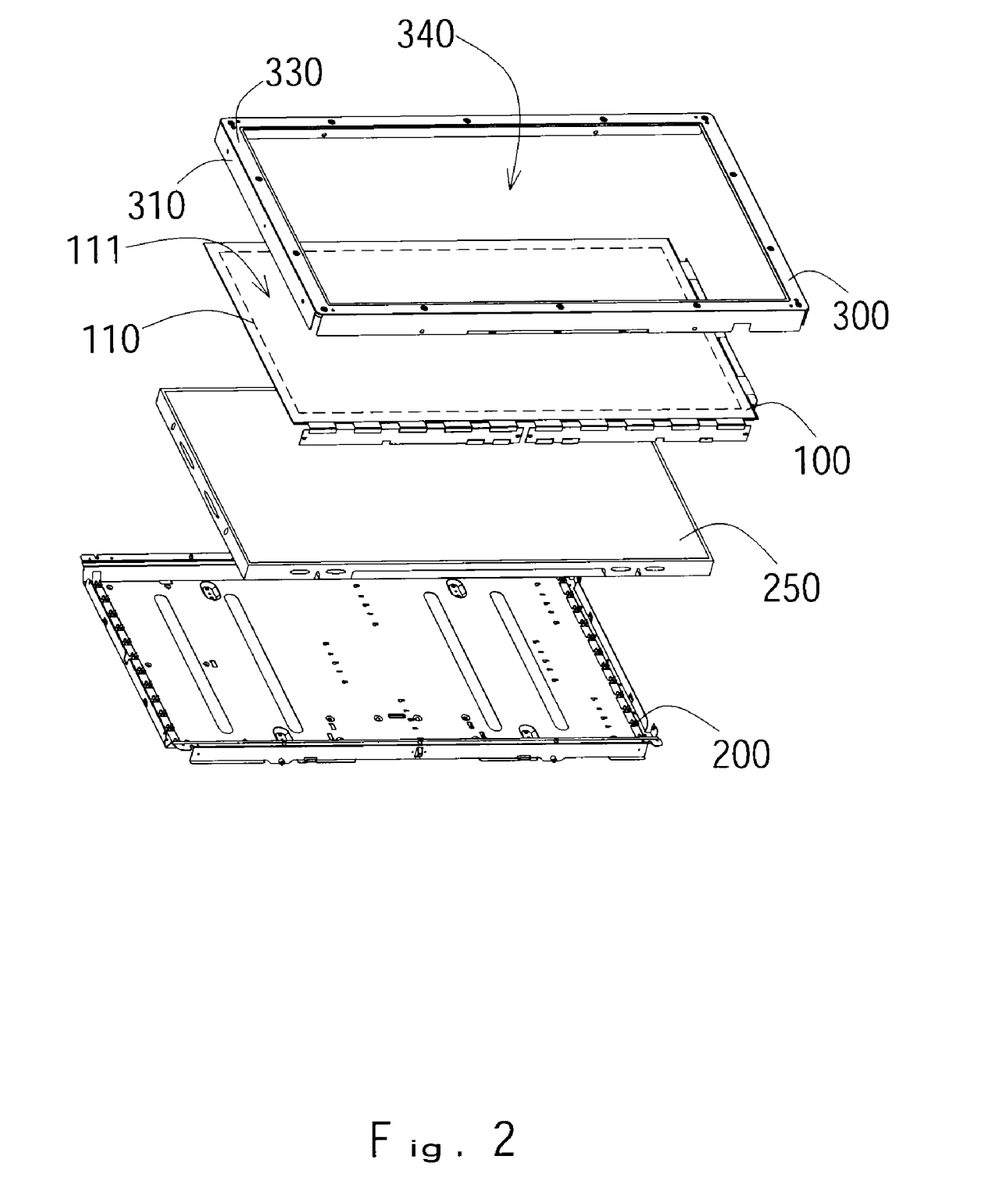
FIG. 2 illustrates the exploded view of an embodiment of the display device of the present invention.

The display device of the present invention includes a display panel 100, a base 200 and a front frame 300, wherein the display panel 100 is disposed between the base 200 and the front frame 300. The display panel 100 in the embodiment shown in FIG. 2 is a transmissive LCD panel and the display device includes a backlight module 250 disposed between the display panel 100 and the base 200. However, in different embodiments, the display panels 100 can be transflective LCD panels, OLED display panel and other types of display panel. The backlight module 250 and other components in the display device may be adjusted, omitted or altered to accommodate different types of the display panels 100. For instance, the base 200 can be used as a backplane for the backlight module 250 or as a rear cap for the display device.

Figure 3:
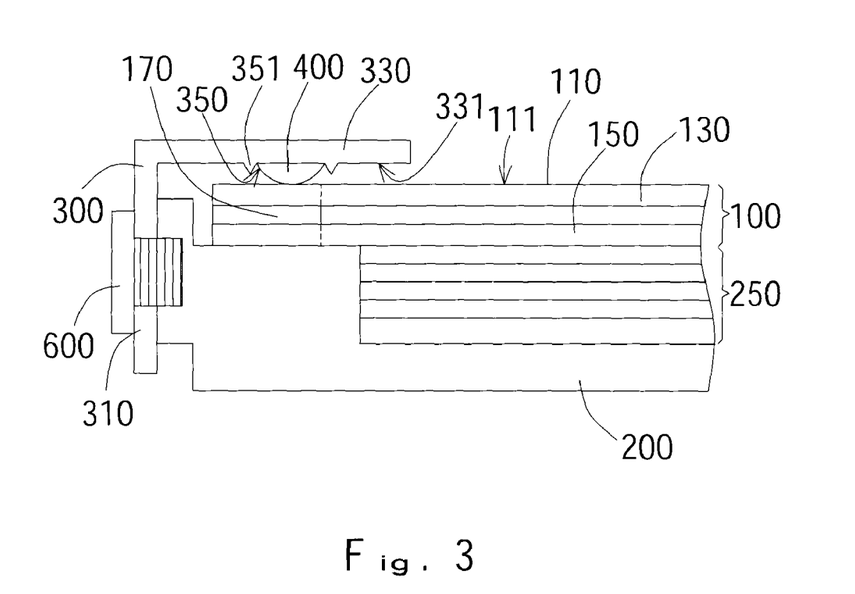
FIG. 3 illustrates the sectional view of the embodiment of the display device of the present invention.

As shown in FIG. 2 and FIG. 3, the display panel 100 has a display surface 110 where the images are displayed. The display surface 110 has an active area 111 and the active area 111 is preferred to be disposed at the center position of the display surface 110. The display surface 111 described in this section refers to the area of the display surface 110 which produces images. In the embodiment shown in FIG. 3, the display panel is composed of an upper substrate 130 and a lower substrate 150. A sealant 170 is disposed at the edges of the upper substrate 130 and the lower substrate 150. Liquid crystal molecules are injected into space between the upper substrate 130, the lower substrate 150 and the sealant 170. In the present embodiment, the sealant 170 is disposed on the outside of the active area 111. The active area 111 represents part or entire area of the display surface 110 corresponding to the sealant 170.

In the embodiments shown in FIG. 2 and FIG. 3, when the display device is placed horizontally, the front frame 300 partly covers the display panel 100 as well as the lateral sides of the display panel 100 and the base 200. The front frame 300 includes a side wall 310 and a top plate 330. The side wall 310 corresponds to the lateral sides of the display panel 100 and is preferred to be perpendicular to the display surface 110 of the display panel 100. In a more preferred embodiment, the side wall 310 is a closed rectangular wall enclosing the display panel 100. However, in different embodiments, the side wall 310 can also be an open-ended wall such as two long sides corresponding to the display panel 100.

As shown in FIG. 2 and FIG. 3, the top plate 330 extends from a top edge of the side wall 310, along the display surface 110 of the display panel 100 and towards center of the display panel 100. The top plate 330 is preferred to enter the space corresponding to the interior of the display panel 100 where the sealant 170 is disposed. However, in different embodiments, the top plate 330 extends not inwards, and only reaches the sealant 170. As it can be seen from FIG. 2, the front frame 300 has an opening 340 formed by encircling the top plate 330. The active area 111 of the display panel 100 corresponds to the opening 340 and displays the images outwards through the opening 340.

As FIG. 3 shows, the top plate 330 has an inner surface 331. The inner surface 331 faces the display surface 110 of the display panel 100. A groove 350 is formed on the inner surface 331 along the side wall 310, wherein a width of the groove 350 is preferred to be less than 10 millimeters. In the embodiment shown in FIG. 3, the inner surface 331 of the top plate 330 has a pair of flanges 351 and the groove 350 is formed between the pair of flanges 351. The pair of flanges can be formed through injection-molding, stamping molding or other processes, and the above-mentioned processes can be adjusted to accommodate the material of the top plate 330. However, in the embodiment shown in FIG. 4, the groove 350 is formed by hollowing out the inner surface 331 of the top plate 330 towards the opposite side of the inner surface 331. In the present embodiment, the groove 350 can be formed by bending the top plate 330 or by using injection-molding to form the groove 350 on the top plate 330.

Figure 4:
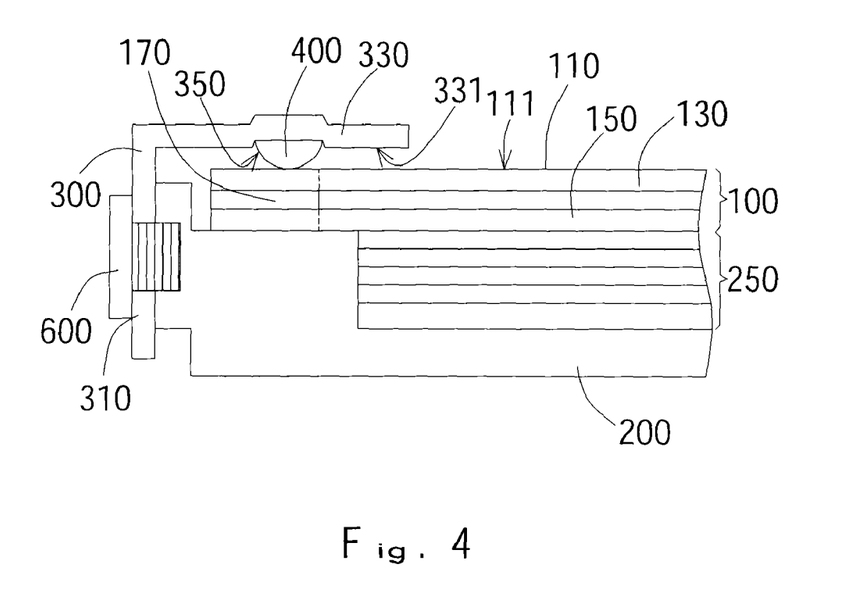
FIG. 4 illustrates the cross-sectional view of another embodiment of the display device of the present invention.

As shown in FIG. 3 and FIG. 4, the front frame 300 includes a cushion filler 400. The cushion filler is disposed in the groove 350 with its top protruding from the groove 350 and from the inner surface 331 of the top plate 330. In the embodiment shown in FIG. 3, the top of the cushion filler 400 protrudes from space between the pair of flanges 351. In the embodiment shown in FIG. 4, the top of the cushion filler 400 protrudes from the hollow on the inner surface 331 of the top plate 330. Furthermore, in the embodiments shown in FIG. 3 and FIG. 4, the top of the cushion filler 400 contacts the display surface 110 of the display panel 100 corresponding to the sealant 170. However, in different embodiments, the cushion filler 400 can also contact other positions on the outside of the active area 111 of the display surface 110.

In a more preferred embodiment, a height of the cushion filler protruding from the inner surface 331 of the top plate 330 is less than 3 millimeters. However, in different embodiments, this height can be increased or adjusted in accordance with the material of the cushion filler 400 and with the width of the groove 350. When the display device is subject to external forces and presses the front frame 300, the cushion filler 400 can then be used as a support for the top plate 310 outside the active area 111, to prevent the top plate 310 from pressing the active area 111 of the display panel 100. In other words, the disposition of the cushion filler 400 reduces the possibility that an external force compels the top plate 310 to press the display panel 100 which may affects the displayed images. Furthermore, the cushion filler 400 can be made of materials with dark or black colors which renders improved shading effect for the front frame 300.

Materials of the cushion filler 400 can be made from a room temperature hardening material, a thermo-hardening material, a thermoplastic macromolecular material, a photo-hardening macromolecular material or a mixture thereof. However, in a more preferred embodiment, the thermo-hardening material used to make the cushion filler 400 is selected from a group consisting of polyester resin, epoxy matrix resin, polymerized siloxanes, polyurethane and a mixture thereof. The thermoplastic macromolecular material may include polyethylene, polyvinyl chloride (PVC), polymethylmethacrylate (PMMA), polyimide (PI) and mixtures thereof. The photo-hardening macromolecular material includes polyurethane, diacrylate, epoxy diacrylate and a mixture thereof. However, the viscosity of the cushion filler 400 is preferred to be less than 55 Pa·s (Pascal second) which corresponds to the required fluidity of the cushion filler 400 in the groove 350. Furthermore, a cushion filler 400 composed of two or more materials may be disposed in the same section of the groove 350.

Figure 5:
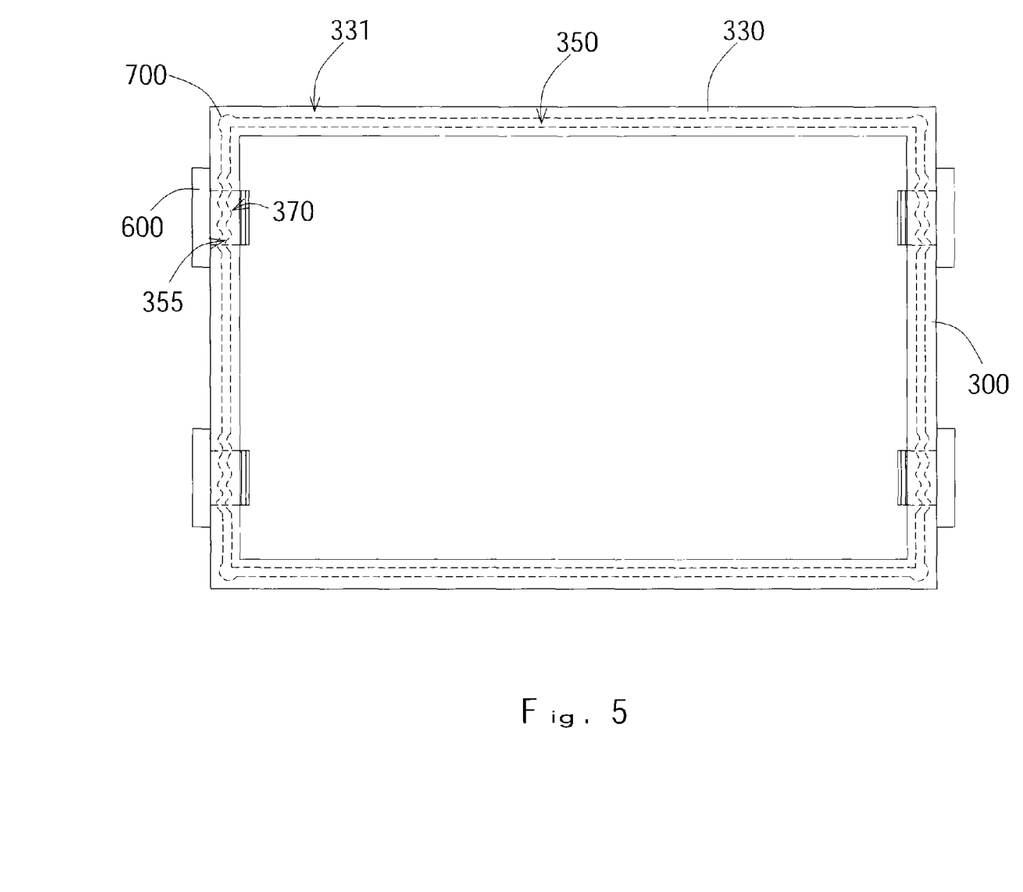
FIG. 5 illustrates the top view of an embodiment of the front frame.

As shown in FIG. 3, FIG. 4 and FIG. 5, apertures 370 are formed on the side wall 310 of the front frame 300. The display device has a screw 600 passing through the aperture 370 and fastening the front frame 330 on the lateral sides of the base 200. Furthermore, the aperture 370 can be formed on the top surface of the front frame 330 and thus the screw 600 could fasten the front frame 300 on the front surface of the base 200. In the embodiment shown in FIG. 5, apertures 370 are disposed at 4 corners of the front frame 300. However, in different embodiments, the position of the aperture 370 can be adjusted in accordance with the space requirement of the design. Furthermore, the front frame 300 and the base 200 can be coupled together using double-sided tape or other methods.

Figure 6A:
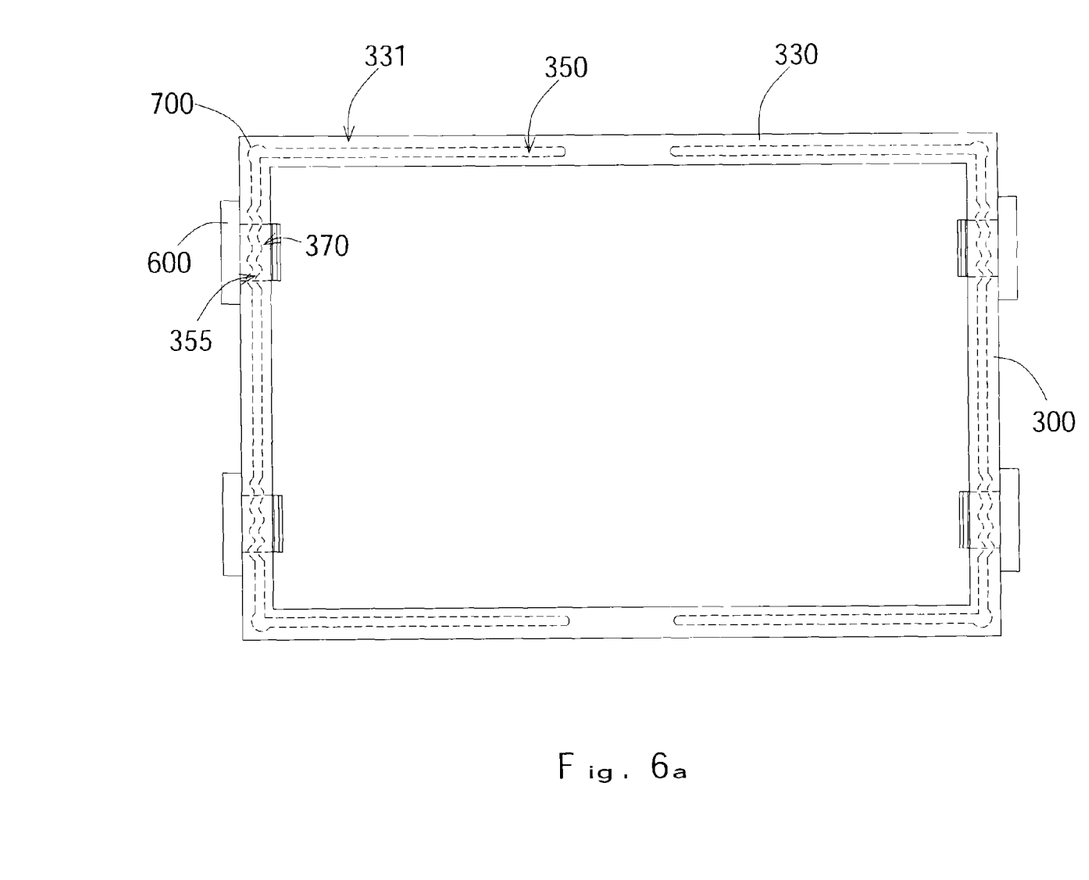
FIG. 6a illustrates the top view of the distribution pattern of the groove.

As FIG. 5 shows, the groove 350 is distributed in a continuous linear shape on the inner surface 331 of the top plate 330. The above-mentioned continuous linear shape includes straight line, curved line, curved line in wave shape, sawtooth line etc. Furthermore, the groove 350 can be formed by connecting line segment of different shapes together. For instance, in the present embodiment, the continuous linear shape of the groove 350 includes several straight lines and lines in wave shape. In the present embodiment, each section of the groove 350 connects together to form a closed ring-shaped area. However, in different embodiments such as the one shown in FIG. 6a, the groove 350 can be formed with continuous line sections which are not closed.

Figure 6B:
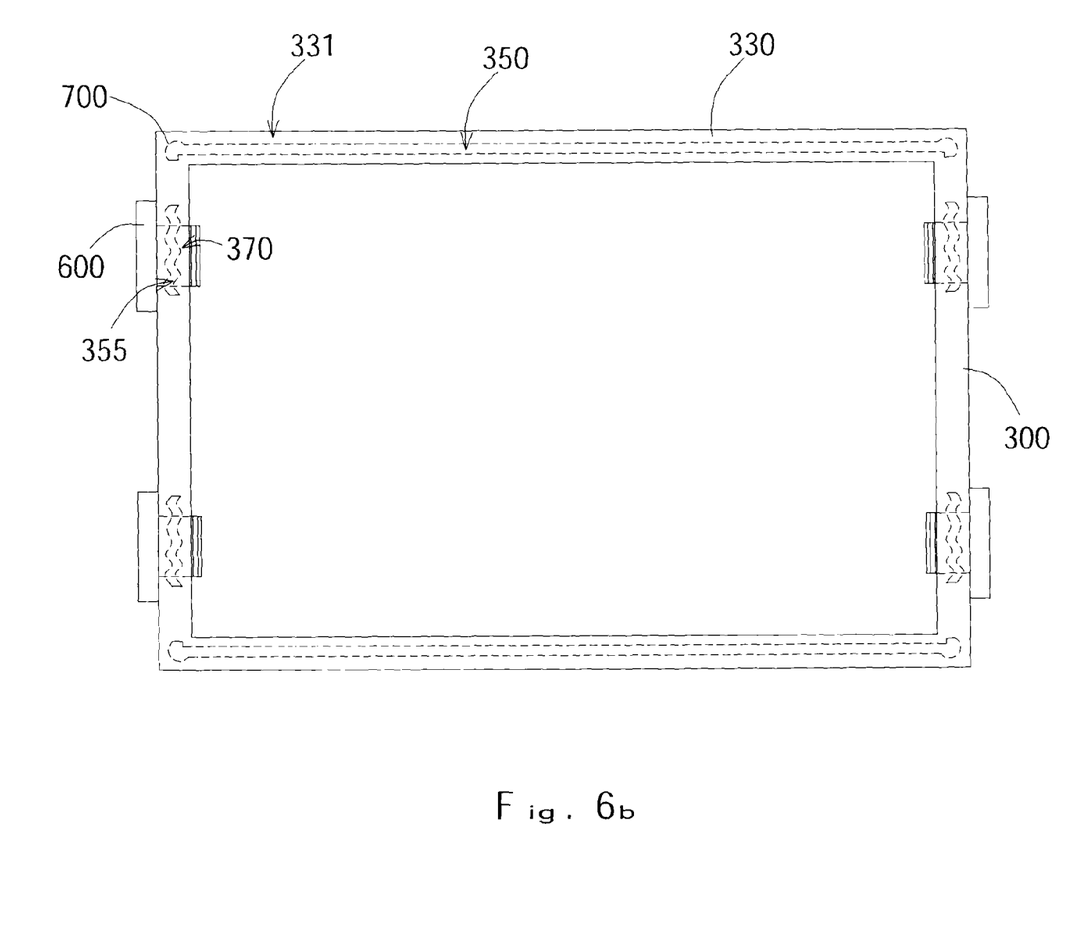
FIG. 6b illustrates the top view of another embodiment of the distribution pattern of the groove.
Figure 6C:
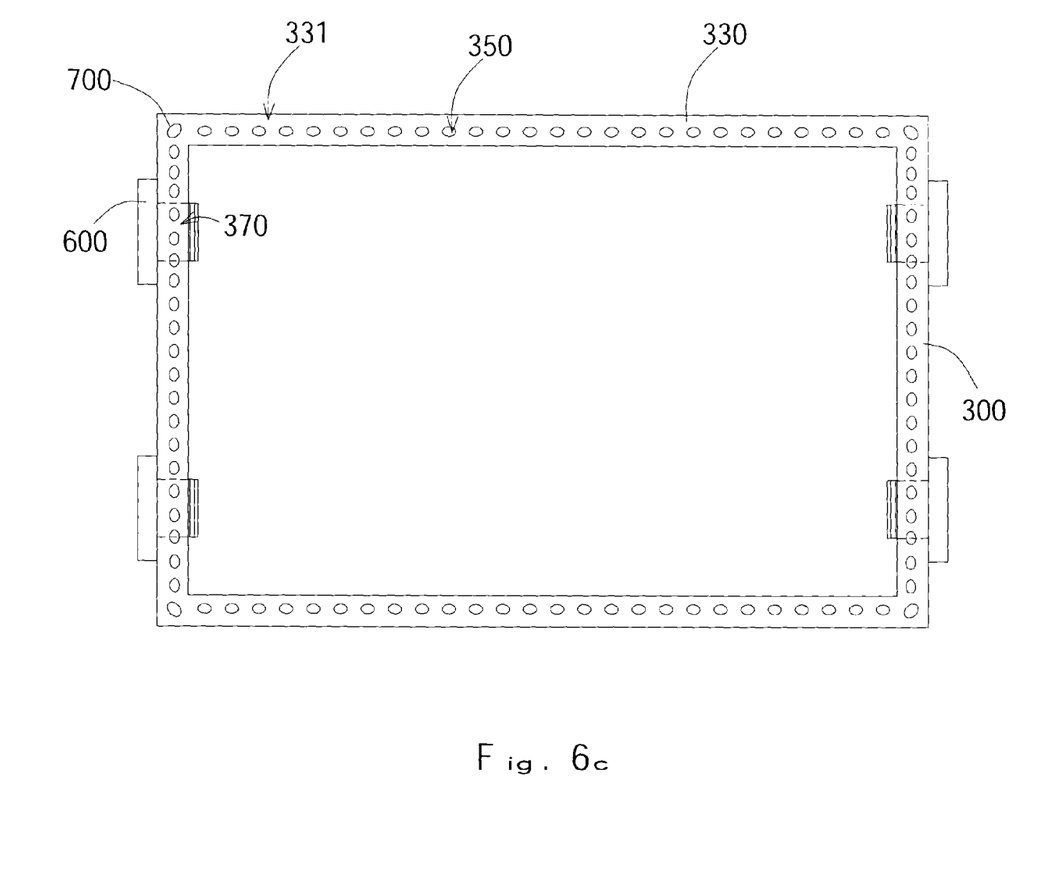
FIG. 6c illustrates the top view of another embodiment of the distribution pattern of the groove.

What is shown in FIG. 6b is another embodiment of the groove 350. In the present embodiment, the groove 350 is discontinuously distributed on the inner surface 331 of the top plate 330. As FIG. 6b shows, the groove 350 is composed of several disconnected line sections distributed along the side wall 310 and on the inner surface 331. Furthermore, in different embodiments, the groove 350 can also have a plurality of disconnected point-shaped hollows, as FIG. 6c shows. The groove 350 is disposed in a discrete pattern, and thus the cushion filler 400 is also disposed separately at different sections of the groove 350.

Figure 7:
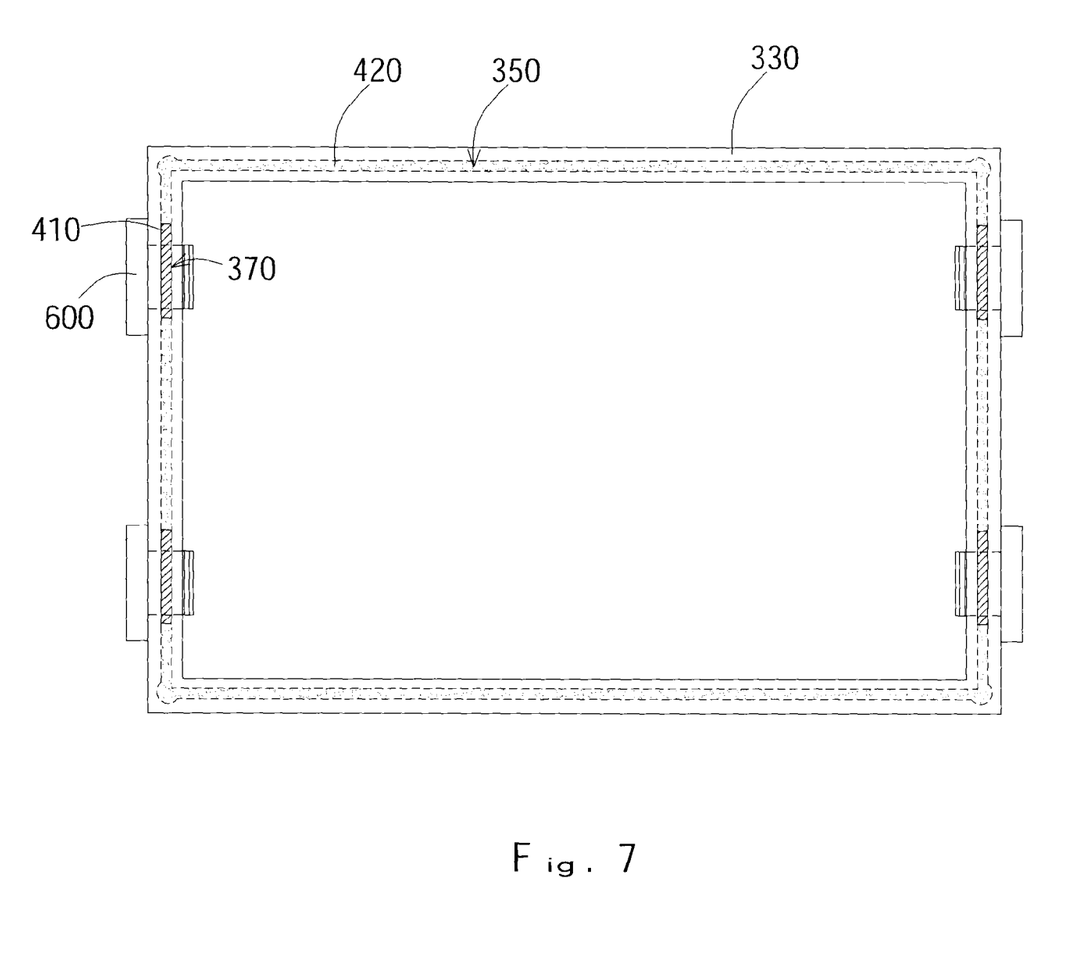
FIG. 7 illustrates the top view of another embodiment of the front frame.

In an embodiment shown in FIG. 5, the groove 350 has a wave-shaped distribution pattern 355, and the wave-shaped distribution pattern 355 corresponds to the aperture 370 on the side wall 310. The section where the aperture 370 is situated is often weak in structure strength and is often exposed to the majority of external forces. Consequently it is preferred to increase the structure strength of the section where the aperture 370 is situated. The disposition of the wave-shaped distribution pattern 355 may increase the contact area of the cushion filler 400 and then the supporting strength of the front frame. Furthermore, in an embodiment shown in FIG. 7, the cushion filler 400 disposed in the groove 350 includes a first filler 410 and a second filler 420, wherein the hardness of the first filler 410 is greater than the hardness of the second filler 420. The first filler 410 is disposed in the groove 350 corresponding to the aperture 370, and the second filler 420 is disposed at the remainder of the groove 350. The difference in hardness between the first filler 410 and the second filler 420 increases the supporting strength of area surrounding the aperture 370 as well as the shock and deformation absorption at the remainder of groove 350. In a more preferred embodiment, the first filler 410 can be selected from a group consisting of polyester resin, polyurethane or a mixture thereof. The second filler 420 can be selected from a group consisting of polymerized siloxanes, polyurethane or a mixture thereof.

Figure 8:
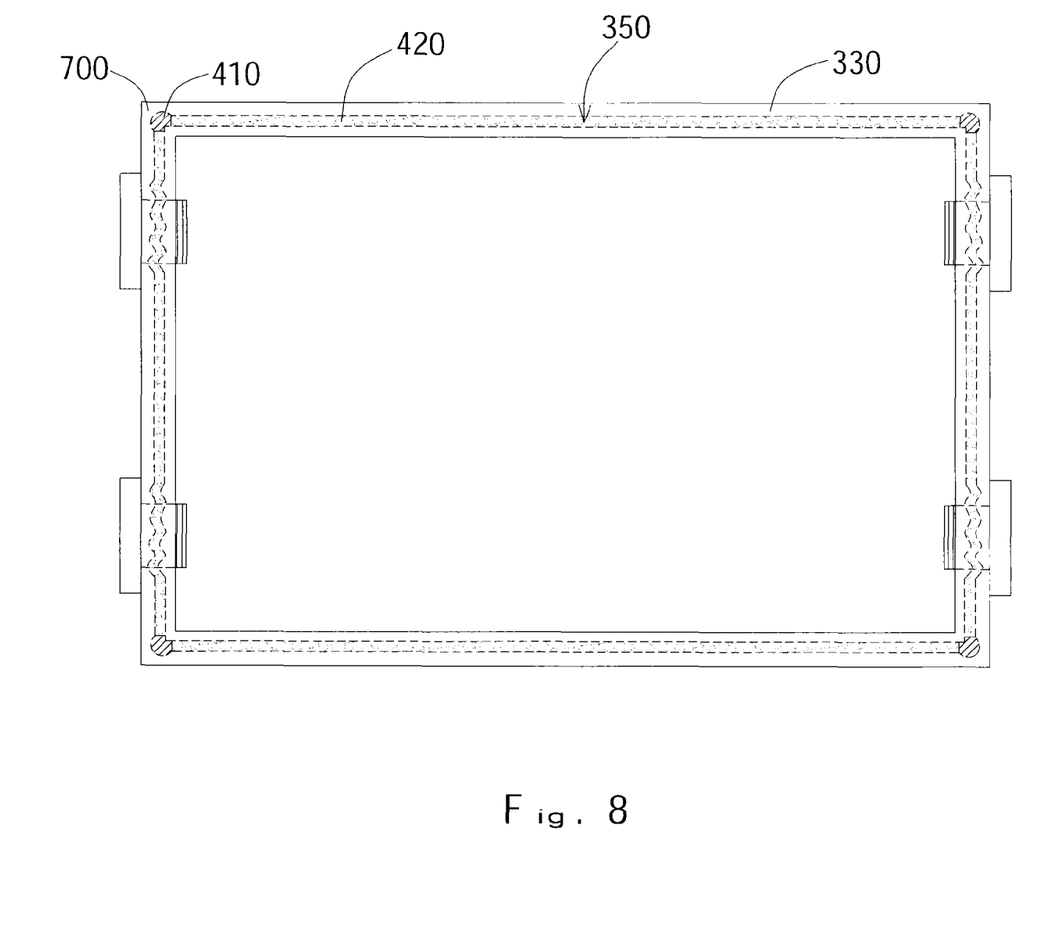
FIG. 8 illustrates the top view of another embodiment of the front frame.

As FIG. 5 shows, the top plate 330 and the side wall 310 respectively has bent parts 700 coupling with different sides of the top plate 330 and the side wall 310 to form the front frame 300. In the present embodiment, the bent parts 700 are disposed at the four corners of the front frame 300. The groove 350 also curves at the position corresponding to the bent part 700. As FIG. 5 shows, the width of the groove 350 at the bent part 700 is greater than the width at the remainder of the groove 350. In other words, the section of the groove 350 with greater width is capable of accommodating more cushion filler 400 and to provide more supporting strength. Furthermore, in the embodiment shown in FIG. 8, the cushion filler 400 disposed in the groove 350 includes a first filler 410 and a second filler 420, wherein the hardness of the first filler 410 is greater than the hardness of the second filler 420. The first filler 410 is disposed in the groove 350 corresponding to the bent part 700. The second filler 420 is disposed at the remainder of the groove 350. The difference in hardness between the first filler 410 and the second filler 420 increases the supporting strength at the bent part 700 as well as the shock absorption and deformation absorption at the remainder of the groove 350. In a more preferred embodiment, the first filler 410 can be selected a group consisting of polyester resin, polyurethane or a mixture thereof. The second filler 420 can be selected a group consisting of polymerized siloxanes, polyurethane or a mixture thereof.

Figure 9:
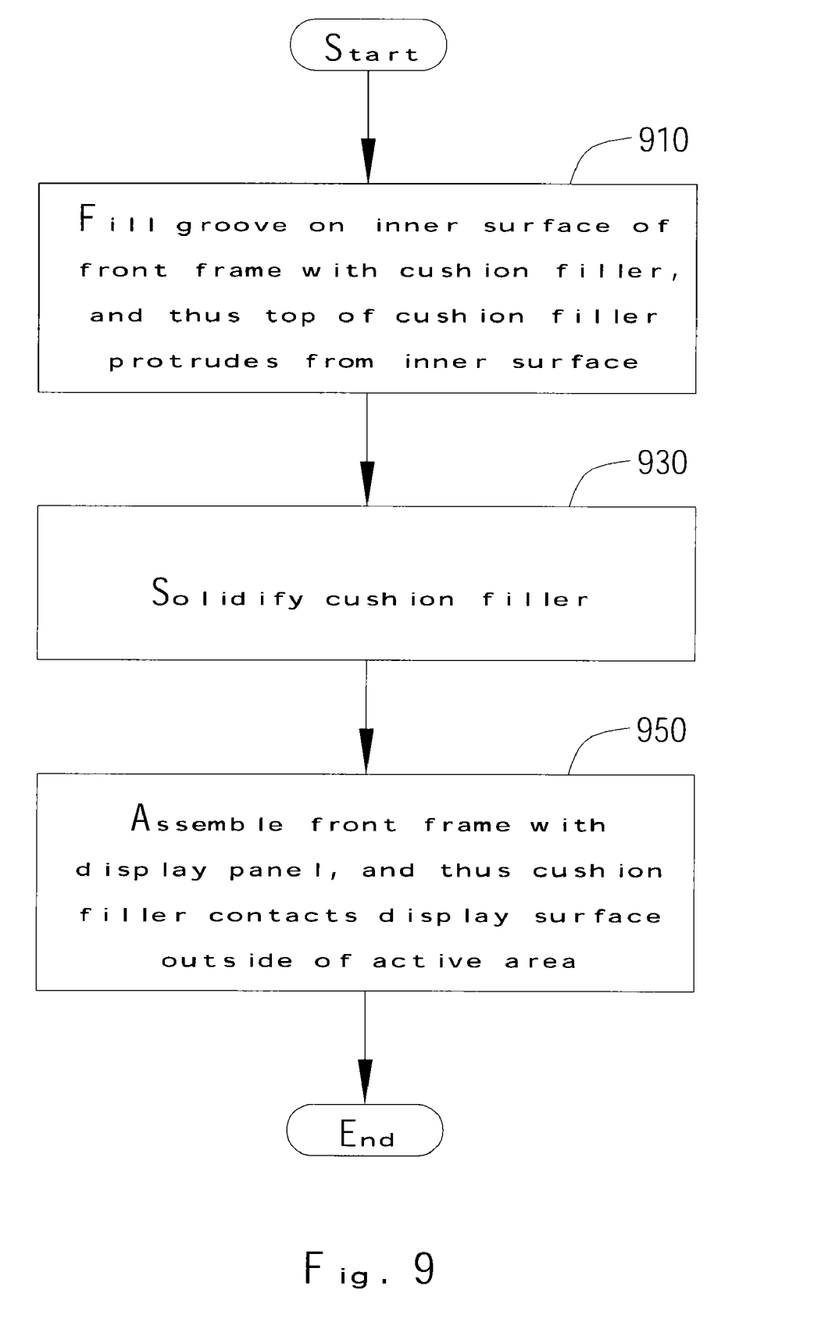
FIG. 9 illustrates the flow chart of the manufacture method of the display device.

FIG. 9 illustrates the flow chart of an embodiment of the manufacture method of the display device of the present invention. A step 910 includes filling the groove 350 on the inner surface 331 of the front frame 300 with the cushion filler 400 and making the top of cushion filler 400 protrudes from the inner surface 331. In a more preferred embodiment, the step 910 employs coating devices such as dispensers to coat the cushion filler 400 onto the groove 350. During the coating process, the coating device injects the cushion filler 400 in the groove 350 to cover part of the groove 350. The cushion filler 400 can then flow and expend itself until the groove 350 is filled.

The step 910 of filling cushion filler 400 further includes filling the groove 350 with the first filler 410 and with the second filler 420 of a lower hardness than the hardness of the first filler 410. The position of the first filler 410 is preferred to correspond to the apertures 370 on the side wall 310 or/and the position of the bent part 700 of the top plate 330. The difference in hardness between the first filler 410 and the second filler 420 can increase the supporting strength at the area surrounding the first filler 410, as well as the shock absorption and the deformation absorption at the remainder of the groove 350. In a more preferred embodiment, the first filler 410 is selected from a group consisting of polyester resin, polyurethane or a mixture thereof. The second filler 420 is be selected from a group consisting of polymerized siloxanes, polyurethane or a mixture thereof.

The step 930 includes solidifying the cushion filler 400. The step will be adjusted in accordance with different types of the cushion filler 400. For instance, if the cushion filler 400 is a thermo-hardening material, the step 930 will adapt heating to solidify the cushion filler 400. If the cushion filler 400 is a thermoplastic macromolecular materials, the step 930 will then apply cooling to solidify the cushion filler 400. If the cushion filler 400 is a photo-hardening macromolecular material, then ultraviolet ray or other suitable light ray will be used to solidify the cushion filler 400.

The step 950 includes assembling the front frame 300 with the display panel 100, and thus the cushion filler 400 could contact a display surface 110 of the display panel 100 outside the active area 111 of the display surface 110. In a more preferred embodiment, the display panel 100 is composed of the upper substrate 130 with the lower substrate 150. The sealant 170 is disposed at the near edge of the upper substrate 130 and the lower substrate 150. The sealant 170 is disposed on the outside of the active area 111. The cushion filler 400 contacts the sealant 170 disposed on the display surface 110, to avoid any influence on the quality in image display of the active area 111.

Figure 10:
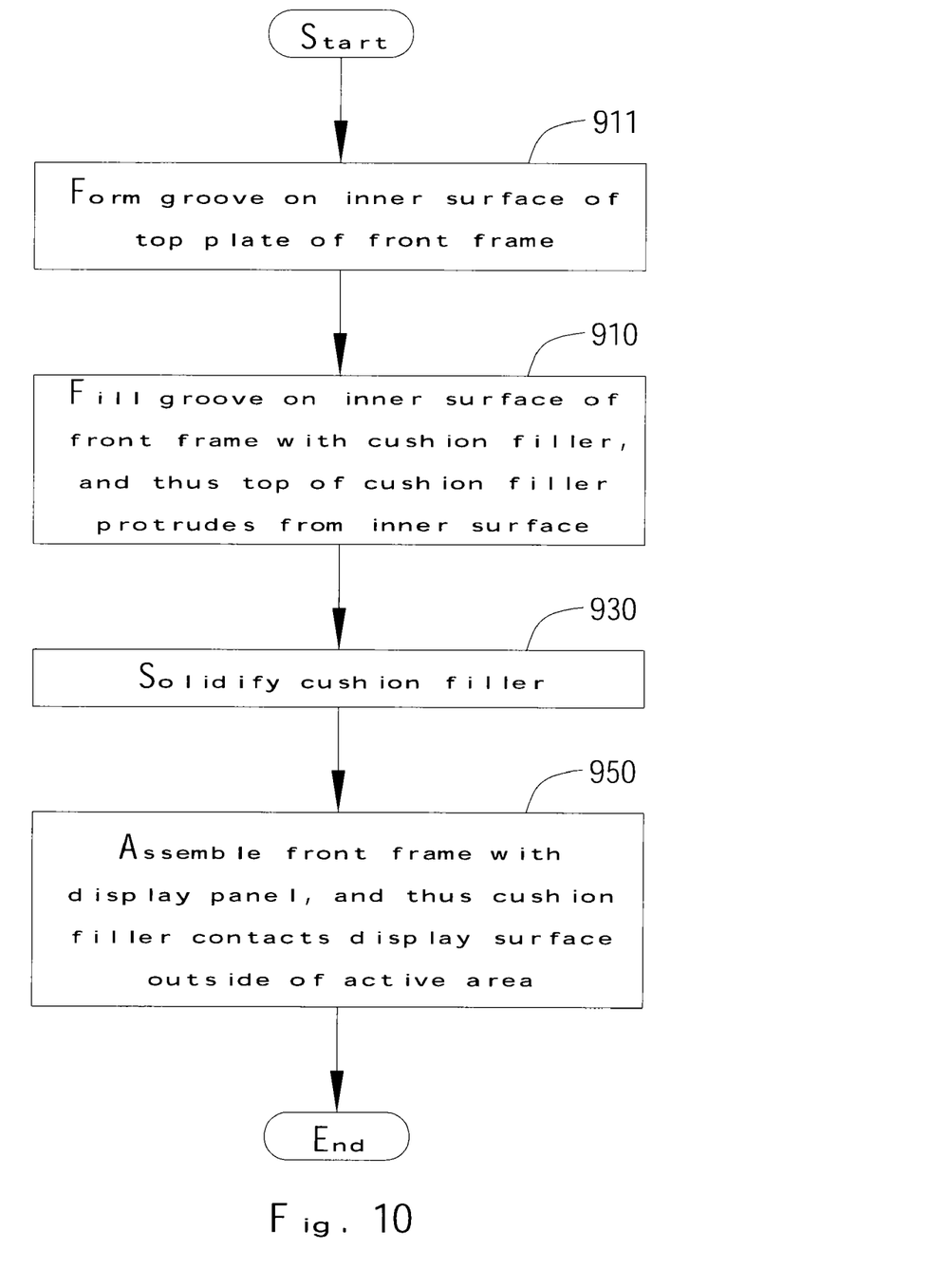
FIG. 10 illustrates the flow chart of another embodiment of the manufacture method of the display device.

The embodiment shown in FIG. 10 further includes a step 911 of forming the groove 350 on the inner surface 331 of the top plate 330 of the front frame 300. The groove 350 is distributed along the side wall 310 of the front frame 300. The groove 350 is preferred to be distributed in a continuous and linear pattern on the inner surface 331 of the top plate 330. The said continuous linear pattern includes straight lines, curved lines, wave-shaped curved lines, sawtooth lines etc. However, in different embodiments, the groove 350 can be discontinuously distributed on the inner surface 331 of the top plate 330.

The step 911 includes disposing a pair of flanges 351 on the inner surface 331 of the top plate 330, and thus the groove 350 is formed between the pair of flanges 351. The processes of forming the pair of flanges 351 includes injection-molding, stamping molding or other processes which can be adjusted in accordance with the material of the top plate 330. However, in different embodiments, the groove 350 can be formed by hollowing out the inner surface 331 of the top plate 330 towards the opposite side of the inner surface 331. In the present embodiment, the groove 350 can be formed through injection-molding or other processes directly on the top plate 330.

The above is a detailed description of the particular embodiment of the invention which is not intended to limit the invention to the embodiment described. It is recognized that modifications within the scope of the invention will occur to a person skilled in the art. Such modifications and equivalents of the invention are intended for inclusion within the scope of this invention.

What is claimed is:

1. A front frame for coupling with a display panel comprising:
   a side wall;
   a top plate extending from a top edge of the side wall towards a centre of the display panel, wherein the top plate has an inner surface, the inner surface has a groove formed along the side wall, an aperture is formed on the side wall or the top plate; and
   a cushion filler disposed within the groove, wherein a top of the cushion filler protrudes from the groove and from the inner surface, the cushion filler includes a first filler and a second filler, the first filler is disposed in a section of the groove corresponding to the position of the aperture, the second filler is disposed in a remainder of the groove, a hardness of the first filler is greater than a hardness of the second filler.

2. The front frame of claim 1, wherein the groove hollows from the inner surface of the top plate and towards an opposite side of the inner surface.

3. The front frame of claim 1, wherein the top plate further includes a pair of flanges disposed on the inner surface, the groove is formed between the pair of flanges.

4. The front frame of claim 1, wherein a height of the top of the cushion filler protruding from the inner surface is less than 3 millimeters.

5. The front frame of claim 1, wherein a width of the groove is less than 10 millimeters.

6. The front frame of claim 1, wherein the groove has a wave-shaped distribution pattern.

7. The front frame of claim 1, wherein the top plate and the side wall have a bent part respectively, the top plate and the side wall together form a frame.

8. The front frame of claim 7, wherein a width of the groove at the bent part of the top plate is greater than the width of the groove at a remainder of the groove.

9. The front frame of claim 7, wherein the first filler is disposed in a section of the groove corresponding to the position of the bent part and the second filler is disposed at the remainder of the groove, a hardness of the first filler is greater than a hardness of the second filler.

10. The front frame of claim 1, wherein the groove has a wave-shaped distribution pattern corresponding to the positions of the aperture.

11. The front frame of claim 1, wherein a viscosity of the cushion filler is less than 100 pascal-second (Pa·s).

12. The front frame of claim 1, wherein the cushion filler is selected from a group consisting of room temperature hardening materials, thermo-hardening materials, thermoplastic macromolecular materials, photo-hardening macromolecular materials, and mixtures thereof.

13. The front frame of claim 12, wherein the cushion filler is selected from a group consisting of polyester resin, epoxy matrix resin, polymerized siloxanes, polyurethane, and mixtures thereof.

14. The front frame of claim 1 further comprising an opening formed by encircling the top plate.

15. The front frame of claim 1, wherein the groove is disposed in a continuous linear pattern on the inner surface of the top plate.

16. The front frame of claim 1, wherein the groove is discontinuously disposed on the inner surface of the top plate.

17. A display device comprising:
   a display panel having a display surface, wherein the display surface has an active area; and
   a front frame comprising:
      a side wall corresponding to lateral sides of the display panel;
      a top plate corresponding to the display surface and extending from a top edge of the side wall towards a center of the display panel, wherein the top plate has an inner surface, a groove is formed on the inner surface along the side wall, an aperture is formed on the side wall or the top plate; and
      a cushion filler disposed in the groove, wherein a top of the cushion filler protrudes from the groove and from the inner surface, and then contacts an outside of the active area of the display surface, the cushion filler includes a first filler and a second filler, the first filler is disposed in a section of the groove corresponding to the positions of the apertures, the second filler is disposed in a remainder of the groove, a hardness of the first filler is greater than a hardness of the second filler.

18. The display device of claim 17, wherein the display panel has a sealant disposed at the outside of the active area, and the cushion filler contacts the display surface at a position corresponding to the sealant disposed on the display surface.

19. The display device of claim 17, wherein the groove hollows into the top plate and towards an opposite side of the inner surface.

20. The display device of claim 17, wherein the top plate further includes a pair of flanges disposed on the inner surface, the groove is formed between the pair of flanges.

21. The display device of claim 17, wherein a height of the top of the cushion filler protruding from the inner surface is less than 3 millimeters.

22. The display device of claim 17, wherein a width of the groove is less than 10 millimeters.

23. The display device of claim 17, wherein the groove has a wave-shaped distribution pattern.

24. The display device of claim 17, wherein each of the top plate and the side wall has a bent part, respectively, and the top plate and the side wall together form a frame.

25. The display device of claim 24, wherein a width of the groove at the bent part of the top plate is greater than the width of the groove at a remainder of the groove.

26. The display device of claim 24, wherein the first filler is disposed in the groove corresponding to the position of the bent part, the second filler is disposed at a remainder of the groove, and a hardness of the first filler is greater than a hardness of the second filler.

27. The display device of claim 17, wherein the groove includes a wave-shaped distribution pattern corresponding to the position of the aperture.

28. The display device of claim 17, wherein a viscosity of the cushion filler is less than 100 pascal-second (Pa·s).

29. The display device of claim 17, wherein the cushion filler is selected from a group consisting of room-temperature hardening materials, thermo-hardening materials, thermoplastic macromolecular materials, photo-hardening macromolecular materials, and mixtures thereof.

30. The display device of claim 29, wherein the cushion filler is selected from a group consisting of polyester resin, epoxy matrix resin, polymerized siloxanes, polyurethane, and mixtures thereof.

31. The display device of claim 17 further comprising an opening formed by encircling the top plate.

32. The display device of claim 17, wherein the groove is disposed in a continuous and linear pattern on the inner surface of the top plate.

33. The display device of claim 17, wherein the groove is discontinuously disposed on the inner surface of the top plate.

34. A manufacture method of a display device comprising:
    filling a cushion filler into a groove on an inner surface of a top plate of a front frame with a top of the cushion filler protruding from the inner surface, wherein the step of filling the groove with cushion filler further includes:
    filling the groove with a first filler and with a second filler, a hardness of the first filler is greater than a hardness of the second filler; and
    filling the groove with the first filler corresponding to a position of an aperture of a side wall;
    solidifying the cushion filler; and
    assembling the front frame with a display panel and thus the cushion filler can contact an outside of an active area on the display surface of the display panel.

35. The manufacture method of claim 34 further comprising forming the groove on the inner surface of the top plate along a side wall of the front frame.

36. The manufacture method of claim 35, wherein the step of forming the groove further includes making the groove hollowing into the top plate and towards opposite side of the inner surface.

37. The manufacture method of claim 35, wherein the step of forming the groove further includes disposing a pair of flanges on the inner surface.

38. The manufacture method of claim 35, wherein the step of forming the groove further includes making the groove having a wider width at a bent part than the width of the groove at remainder of the groove.

39. The manufacture method of claim 35, wherein the step of forming the groove further includes disposing the groove in a wave-shaped pattern.

40. The manufacture method of claim 34, wherein the step of filling the groove with cushion filler further includes using a coating device to coat the groove with the cushion filler.

41. The manufacture method of claim 34, wherein the step of filling the groove with cushion filler further includes filling the groove with the first filler at a position corresponding to a bent part of the top plate.

\* \* \* \* \*